(12) United States Patent
Han et al.

(10) Patent No.: US 11,429,213 B2
(45) Date of Patent: Aug. 30, 2022

(54) TOUCH DISPLAY DEVICE, DISPLAY PANEL AND MANUFACTURING METHOD OF THE SAME

(71) Applicant: LG Display Co., Ltd., Seoul (KR)

(72) Inventors: Jonghyun Han, Seoul (KR); NamKil Park, Paju-si (KR); Seunghyun Kim, Paju-si (KR); DongHyun Byun, Paju-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 17/095,629

(22) Filed: Nov. 11, 2020

(65) Prior Publication Data

US 2021/0157433 A1 May 27, 2021

(30) Foreign Application Priority Data

Nov. 26, 2019 (KR) .................. 10-2019-0152948

(51) Int. Cl.
*G06F 3/041* (2006.01)
*H01L 27/32* (2006.01)
*H01L 51/56* (2006.01)
*G06F 3/044* (2006.01)
*H01L 51/52* (2006.01)

(52) U.S. Cl.
CPC ............ *G06F 3/0412* (2013.01); *G06F 3/044* (2013.01); *H01L 27/323* (2013.01); *H01L 27/3244* (2013.01); *H01L 51/5253* (2013.01); *H01L 51/56* (2013.01); *G06F 2203/04103* (2013.01)

(58) Field of Classification Search
CPC ......... G06F 2203/04103; G06F 3/0412; G06F 3/044; H01L 27/323; H01L 27/3244; H01L 27/3258; H01L 51/5253; H01L 51/56
USPC .................................................. 345/170–178
See application file for complete search history.

(56) References Cited

U.S. PATENT DOCUMENTS

| | | | |
|---|---|---|---|
| 2018/0226454 A1* | 8/2018 | Liu | H01L 27/323 |
| 2018/0348913 A1* | 12/2018 | Lee | G06F 3/0412 |
| 2020/0127220 A1* | 4/2020 | Kim | H01L 51/107 |
| 2021/0111371 A1* | 4/2021 | Cho | H01L 51/56 |
| 2021/0119177 A1* | 4/2021 | Bang | G06F 3/0412 |
| 2021/0157433 A1* | 5/2021 | Han | H01L 51/56 |
| 2021/0210723 A1* | 7/2021 | Han | H01L 51/5253 |

* cited by examiner

*Primary Examiner* — Krishna P Neupane
(74) *Attorney, Agent, or Firm* — Fenwick & West LLP

(57) ABSTRACT

A touch display device can include a display panel in which a plurality of touch electrodes are disposed; at least one dam formed in a form of protruding from a lower surface in a non-display area of the display panel; a plurality of touch lines disposed in a direction intersecting the dam; and a stepped thickness-gap area in which a boundary portion of the non-display area or both sides of the dam has a stepped thickness-gap structure.

21 Claims, 10 Drawing Sheets

TOUCH DISPLAY DEVICE, DISPLAY PANEL AND MANUFACTURING METHOD OF THE SAME

CROSS REFERENCE TO RELATED APPLICATION

This application claims priority from Republic of Korea Patent Application No. 10-2019-0152948, filed on Nov. 26, 2019, which is hereby incorporated by reference in its entirety.

BACKGROUND

1. Field of Technology

The present disclosure relates to a touch display device, a display panel, and a manufacturing method of the same.

2. Description of the Related Art

With the development of the information society, demands for display device for displaying image are increasing in various forms, and in recent years, various display devices such as liquid crystal display (LCD), plasma display panel (PDP), an organic light emitting display are used.

Among these display devices, there is a touch display device that provides a touch-based input method that allows a user to intuitively and conveniently input information or command easily by shifting from a conventional input method such as a button, a keyboard, and a mouse.

In a touch display device, a plurality of touch electrodes are disposed in a display panel so as to sense a user's touch of a display panel, and a touch line connecting the touch electrode with a driving circuit is disposed. In addition, user's touch of the display panel, a touch position, and the like can be detected by sensing a change in capacitance generated by the user's touch for the display panel.

At this time, there is a problem in that it is difficult to dispose the touch electrode in the display panel according to a type or structural characteristics of the touch display device, and a failure such as short or disconnection of a touch line may occur due to a basic structure of the display panel.

SUMMARY

The present disclosure has been made in view of the above problems, and provides a touch display device having a touch line structure, a display panel, and a manufacturing method of the same that can effectively recognize a user's touch in the touch display device.

The present disclosure further provides a touch display device, a display panel, and a manufacturing method of the same that can prevent a failure in touch line by forming a high thickness-gap area of a display panel to a stepped thickness-gap structure.

The present disclosure further provides a touch display device, a display panel, and a manufacturing method of the same that can reduce a thickness-gap by using a photo resist with slit patterns for a high thickness-gap area of the display panel.

The present disclosure further provides a touch display device, a display panel, and a manufacturing method of the same that can reduce a failure in touch line by providing a compensation structure in a touch line positioned in a high thickness-gap area of the display panel.

In an aspect, embodiments of the present disclosure provides a touch display device including: a display panel in which a plurality of touch electrodes are disposed; at least one dam formed in a form of protruding from a lower surface in a non-display area of the display panel; a plurality of touch lines disposed in a direction intersecting the dam; and a stepped thickness-gap area in which a boundary portion of the non-display area or both sides of the dam has a stepped thickness-gap structure.

The stepped thickness-gap area includes a plurality of thickness-gap structures having the same width.

The stepped thickness-gap area includes a plurality of thickness-gap structures having a different width.

The stepped thickness-gap area includes a plurality of thickness-gap structures whose width decreases as it moves away from a display area or the dam.

In another aspect, embodiments of the present disclosure provides a display panel including: an encapsulation layer for preventing foreign matter from penetrating into a lower portion of a display area; at least one dam disposed in an outer periphery of the encapsulation layer in one direction and formed in a form of protruding from a lower surface; a plurality of touch lines disposed in an upper portion of the encapsulation layer and the dam and disposed in a direction intersecting the dam; and a stepped thickness-gap area in which a boundary portion of the display area or both sides of the dam has a stepped thickness-gap structure.

In another aspect, embodiments of the present disclosure provides a method of manufacturing a display panel, including: forming an encapsulation layer in a lower portion of a display area so as to prevent foreign matter from penetrating; forming a metal layer in an outer periphery of the encapsulation layer; forming a photo resist with slit patterns in an area corresponding to a boundary portion of the display area or both sides of the dam; and etching a portion of the metal layer or the encapsulation layer by using the photo resist with slit patterns so that the boundary portion of the display area or the both sides of the dam has a stepped thickness-gap.

The photo resist includes a slit pattern area corresponding to a stepped thickness-gap area; and a planar area corresponding to an area excluding the stepped thickness-gap area.

The slit pattern area includes a plurality of separate slits having the same width.

The slit pattern area includes a plurality of separate slits having a different width.

The slit pattern area includes a plurality of separate slits whose width decreases as it moves away from the display area or the dam.

The width of the separate slit varies depending on material of the photo resist.

The photo resist with slit patterns is formed using a halftone mask or a diffraction mask.

In another aspect, embodiments of the present disclosure provides a touch display device including: a display panel in which a plurality of touch electrodes are disposed; at least one dam formed in a form of protruding from a lower surface in a non-display area of the display panel; and a plurality of touch lines disposed in a direction intersecting the dam, and having a touch line compensation area in which a line width of a touch line positioned in a protruding portion of the dam is extended in a length direction of the dam.

The touch display device further includes a stepped thickness-gap area in which a boundary portion of the non-display area or both sides of the dam has a stepped thickness-gap structure.

In another aspect, embodiments of the present disclosure provides a display panel including: an encapsulation layer for preventing foreign matter from penetrating into a lower portion of a display area; at least one dam disposed in an outer periphery of the encapsulation layer in one direction and formed in a form of protruding from a lower surface; and a plurality of touch lines disposed in a direction intersecting the dam, and having a touch line compensation area in which a line width of a touch line positioned in a protruding portion of the dam is extended in a length direction of the dam.

According to embodiments of the present disclosure, it is possible to provide a touch display device having a touch line structure, a display panel, and a manufacturing method of the same that can effectively recognize a user's touch in the touch display device.

In addition, according to embodiments of the present disclosure, it is possible to provide a touch display device, a display panel, and a manufacturing method of the same that can prevent a failure in touch line by forming a high thickness-gap area of a display panel to a stepped thickness-gap structure.

In addition, according to embodiments of the present disclosure, it is possible to provide a touch display device, a display panel, and a manufacturing method of the same that can reduce a thickness-gap by using a photo resist with slit patterns for a high thickness-gap area of the display panel.

In addition, according to embodiments of the present disclosure, it is possible to provide a touch display device, a display panel, and a manufacturing method of the same that can reduce a failure in touch line by providing a compensation structure in a touch line positioned in a high thickness-gap area of the display panel.

BRIEF DESCRIPTION OF THE DRAWINGS

The above and other objects, features and advantages of the present disclosure will be more apparent from the following detailed description in conjunction with the accompanying drawings, in which.

DETAILED DESCRIPTION

Figure 1:
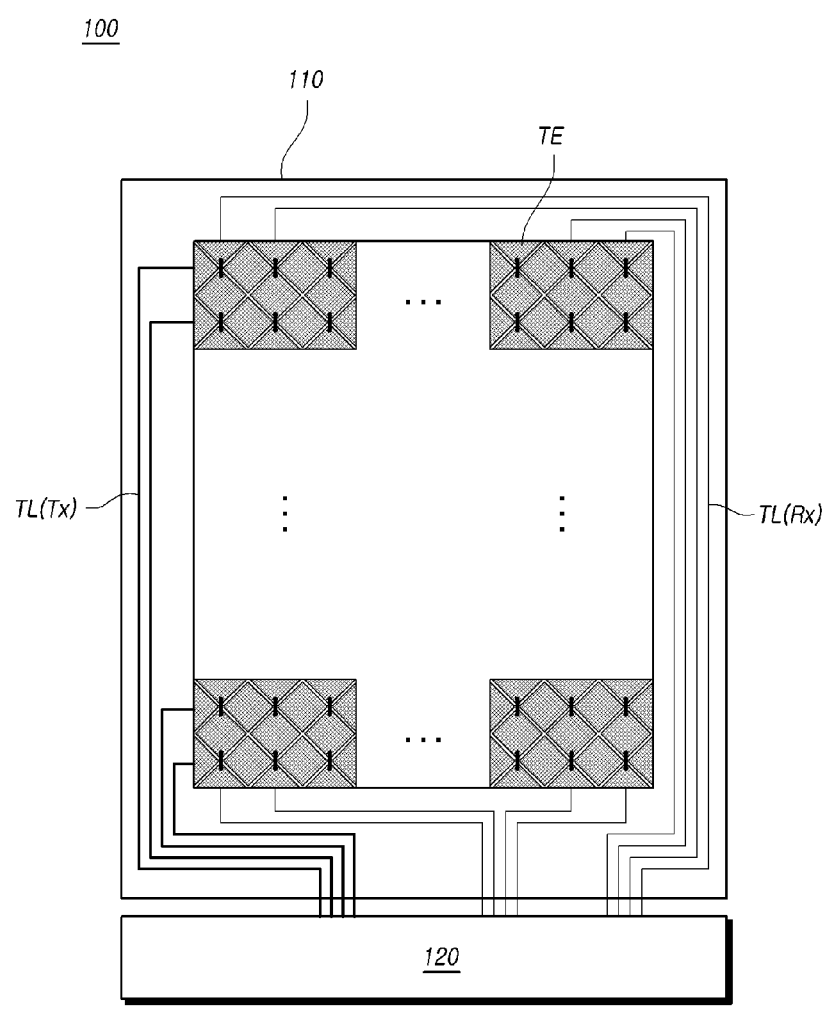
FIG. 1 is a system configuration diagram of a touch display device according to embodiments of the present disclosure.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description may make the subject matter in some embodiments of the present invention rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present invention. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

FIG. 1 is a system configuration diagram of a touch display device according to embodiments of the present disclosure.

Referring to FIG. 1, a touch display device 100 according to embodiments of the present disclosure includes a display panel 110 in which a plurality of touch electrodes TE and a plurality of touch lines TL are disposed, and a driving circuit 120 which outputs a touch driving signal to the touch electrode TE and senses a touch based on a touch sensing signal received from the touch electrode TE.

The display panel 110 may be divided into a display area in which a plurality of subpixels are disposed and which displays an image, and a non-display area which is positioned outside the display area and in which signal line or the like for transmitting a signal applied to the sub-pixel is disposed.

In the display area of the display panel 110, a gate line and a data line are disposed to intersect with each other, and a subpixel is disposed in an area where a gate line and a data line intersect.

The sub-pixel disposed in the display area expresses grayscale according to a data voltage supplied through the data line based on the timing of a scan signal applied to the gate line so that an image can be displayed through the display area.

In addition to a configuration for driving the display, a plurality of touch electrodes TE for sensing a user's touch may be disposed in the display area.

In the case where the touch display device 100 is a liquid crystal display device, in the plurality of touch electrodes TE, a common electrode disposed in the display area may be used as the touch electrode TE. When the touch display device 100 is an organic light emitting display device, the touch electrode TE may be disposed in an upper portion of an encapsulation layer, but is not limited thereto.

Figure 2:
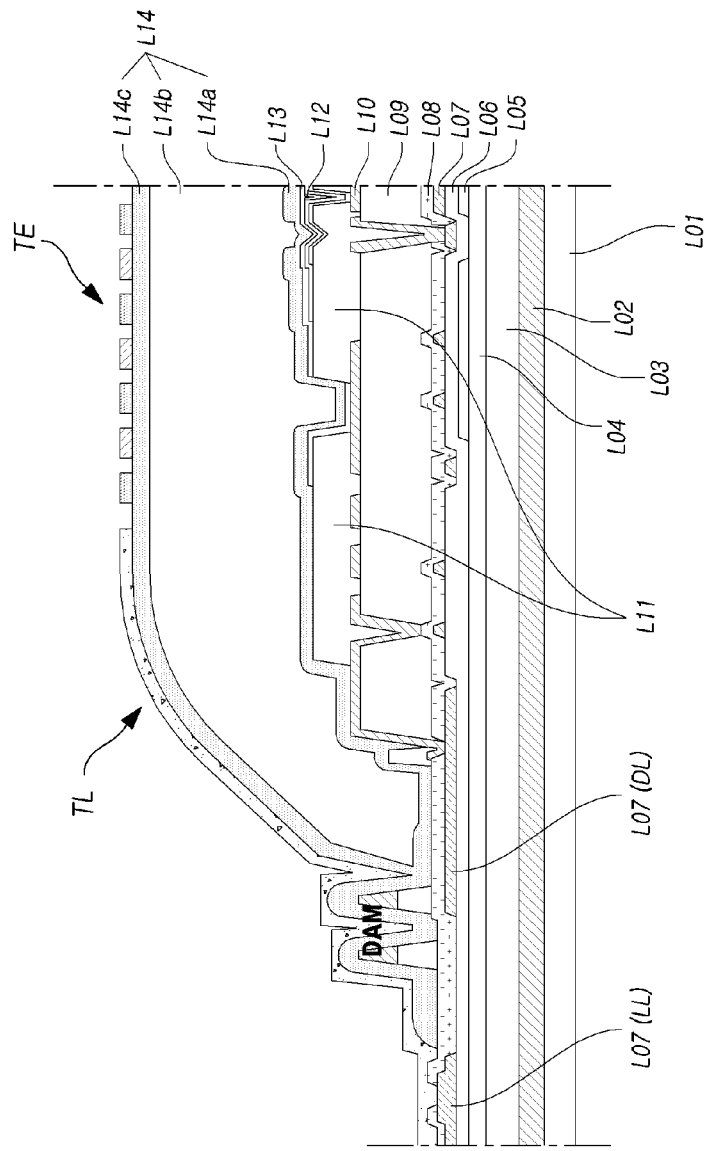
FIG. 2 is a cross-sectional view illustrating a structure of a non-display area of a display panel in a touch display device according to embodiments of the present disclosure.

FIG. 2 is a cross-sectional view illustrating a structure of a non-display area of a display panel in a touch display device according to embodiments of the present disclosure.

Referring to FIG. 2, in the touch display device 100 according to embodiments of the present disclosure, the display panel 110 has a polyimide (PI) layer L02 that is positioned on a substrate or a back plate L01.

A buffer layer L03 may be positioned on the polyimide layer L02, and an interlayer insulating layer L04 may be positioned on the buffer layer L03.

A gate layer L05 may be exist on the interlayer insulating layer L04, and a gate electrode or the like may be formed at every necessary position in the gate layer L05.

A gate insulating layer L06 may be exist on the gate layer L05, and a source/drain layer L07 may be exist on the gate insulating layer L06.

In the source/drain layer L07, a signal line such as a data line DL and a gate line GL, and a source/drain electrode of various transistors may be formed.

A protective layer L08 may exist on the source/drain layer L07.

A planarization layer L09 is positioned on the protective layer L08, and a first electrode layer L10 on which a first electrode is formed in a light emission position of each subpixel may exist on the planarization layer L09.

A bank layer L11 is positioned on the first electrode layer L10, and an electroluminescent layer L12 is positioned on the bank layer L11.

A second electrode layer L13 that is commonly formed in all sub-pixel area may exist on the electroluminescent layer L12.

An encapsulation layer L14 for reducing penetration of moisture, air, or the like may exist on the second electrode layer L13.

In addition, a dam DAM which protrudes from the lower surface and is stacked higher than the surroundings may exist in the outer periphery of the display panel 110 for the purpose of reducing the likelihood of the encapsulation layer L14 from collapsing.

The encapsulation layer L14 may be formed of a single layer, two or more layers may be stacked, or two or more organic and inorganic layers may be stacked.

Here, the case where the encapsulation layer L14 is stacked with a first encapsulation layer L14a, a second encapsulation layer L14b, and a third encapsulation layer L14c is shown.

Each of the first encapsulation layer L14a, the second encapsulation layer L14b, and the third encapsulation layer L14c may be an organic material layer and an inorganic material layer.

For example, the thickness of the encapsulation layer L14 may be 5 μm or more.

As described above, by designing the thickness of the encapsulation layer L14 to be a certain thickness or more, parasitic capacitance formed between a cathode of the organic light emitting diode OLED and the touch electrode TE can be reduced. Accordingly, it is possible to reduce a reduction in sensitivity of touch sensing due to the parasitic capacitance.

The touch electrode TE and the touch line TL may be disposed on the encapsulation layer L14.

In this case, the touch line TL may be disposed on the encapsulation layer L14 and the dam DAM, but there is a problem in that a failure may occur during the process of the touch line TL disposed in the upper portion of the dam DAM due to a thickness-gap of the dam DAM.

Figure 3:
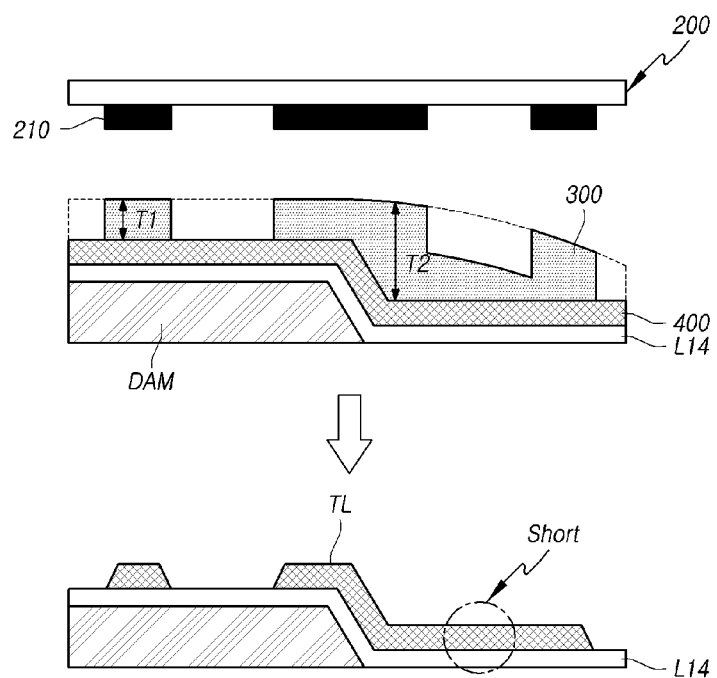
FIG. 3 is a cross-sectional view illustrating an example of a process of forming a touch line on a dam upper portion of a non-display area in a touch display device.

FIG. 3 is a cross-sectional view illustrating an example of a process of forming a touch line TL on a dam upper portion of a non-display area in a touch display device.

Referring to FIG. 3, an encapsulation layer L14 and a conductive layer 400 for the touch line TL are deposited in a non-display area of the touch display device 100 to cover the dam. Thereafter, a liquid photo resist 300 is coated on the conductive layer 400. At this time, the thickness T2 of the photo resist 300 formed in a thickness-gap area between the lower protective layer L08 along the side surface of the dam DAM is formed to be thicker than the thickness T1 of the photo resist 300 formed in the upper area of the dam DAM.

When exposing the photo resist 300 by a photomask 200 having a light blocking layer 210, if an exposure amount is determined based on the thickness T1 of the photo resist 300 formed in the upper area of the dam DAM, the photo resist 300 thickly formed in the thickness-gap area T2 between the side surface of the dam DAM and the protective layer L08 is not properly exposed and remains as a residual film after a development process.

When the conductive layer 400 is etched using patterns of a photo resist 300 in a state in which the residual film exists, a short circuit occurs between the touch lines TL formed in the area where the residual film exists.

Figure 4:
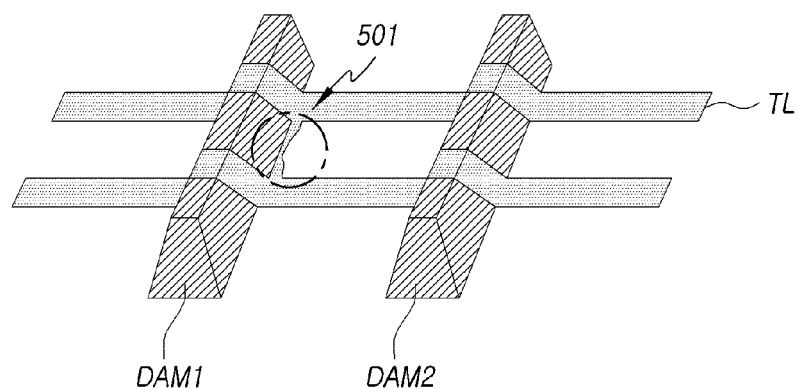
FIG. 4 is a diagram illustrating an example in which a short circuit of touch line occurs in a portion where a dam is formed in a non-display area of display panel in a manufacturing process of touch display device.
Figure 5:
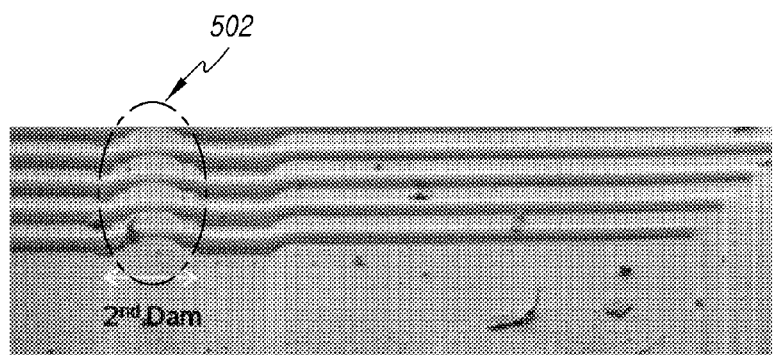
FIG. 5 is a diagram illustrating an example in a case where a touch line is disconnected by an upper portion of a dam in a non-display area of a display panel in a manufacturing process of touch display device.

FIG. 4 is a diagram illustrating an example in which a short circuit of a touch line occurs in a portion where a dam is formed in a non-display area of display panel in a manufacturing process of touch display device, and FIG. 5 is a diagram illustrating an example in a case where a touch line is disconnected by an upper portion of a dam.

Referring to FIG. 4, two dams DAM1, DAM2 may be disposed in the outer periphery of the display panel 110, and the touch line TL may be disposed in a direction intersecting the direction in which the dam DAM is disposed.

At this time, in the process of forming the touch line TL along the shape of the dam DAM with a thickness-gap, due to the high thickness-gap in the area where the dam is disposed, the residual film of the photo resistor used to etch the encapsulation layers L14 may remain in the lower boundary of the dam DAM.

As described above, the area where the residual film of the photo resist remains is represented by a touch line short area 501 because a short circuit may occur between two adjacent touch lines TL.

In addition, referring to FIG. 5, since the dam DAM formed in the outer periphery of the display panel 110 is implemented in a structure that protrudes upward, the thickness of the touch line TL passing through the protruding area in the upper portion of the dam becomes thinner so that a touch line disconnection area 502 in which the touch line TL is disconnected may occur.

In order to solve this problem, the touch display device 100 according to embodiments of the present disclosure reduces a thickness-gap by applying a photo resist with slit patterns to a high thickness-gap area in the non-display area of the display panel 110, thereby reducing failure in the touch line TL.

Figure 6:
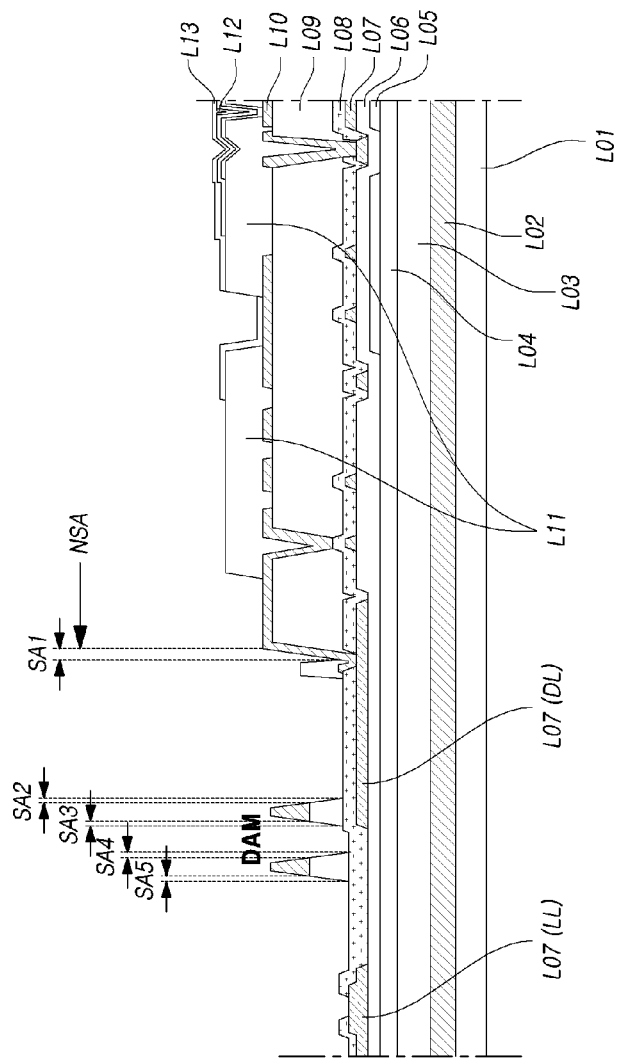
FIG. 6 is a plan view illustrating a case in which a high thickness-gap area and a low thickness-gap area are divided so as to form a photo resist with slit patterns to correspond to a high thickness-gap area of display panel in a touch display device according to embodiments of the present disclosure.
Figure 7:
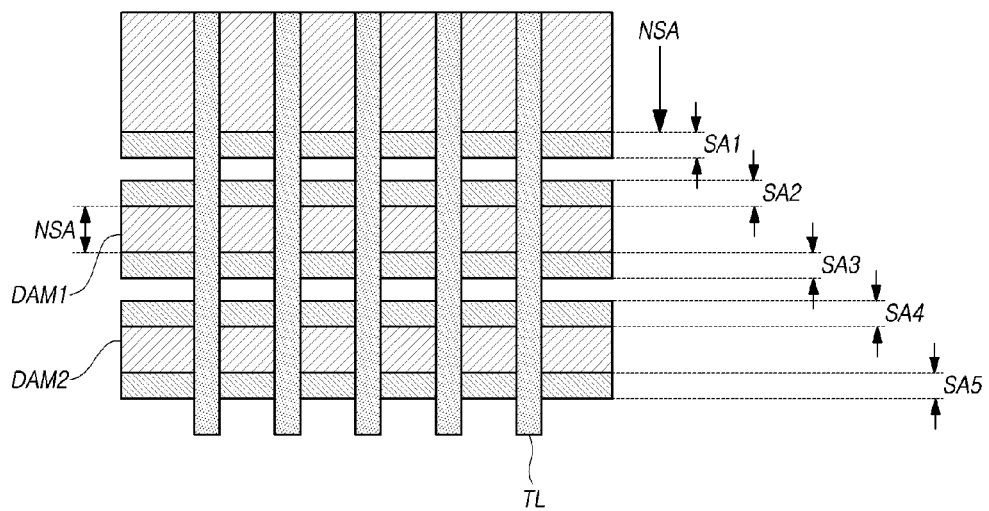
FIG. 7 is a cross-sectional view illustrating a case in which a slit area and a non-slit area are divided so as to form a photo resist with slit patterns to correspond to a high thickness-gap area of a display panel in a touch display device according to embodiments of the present disclosure.

FIG. 6 is a plan view illustrating a case in which a high thickness-gap area and a low thickness-gap area are divided so as to form a photo resist with slit patterns to correspond to a high thickness-gap area of display panel in the touch display device according to embodiments of the present disclosure, and FIG. 7 is a cross-sectional view illustrating a case corresponding to a non-display area a display panel.

Referring to FIGS. 6 and 7, in the display panel 110 of the touch display device 100 according to embodiments of the present disclosure, a polyimide (PI) layer L02 may be positioned on the substrate or the back plate L01, a buffer layer L03 may be positioned on the polyimide layer L02, and an interlayer insulating layer L04 may be positioned on the buffer layer L03.

In addition, a gate layer L05 may be formed on the interlayer insulating layer L04, a gate insulating layer L06 may exist on the gate layer L05, and a source/drain layer L07 may exist on the gate insulating layer L06.

In addition, a protective layer L08 is formed on the source/drain layer L07, a planarization layer L09 is positioned on the protective layer L08, and a first electrode layer L10 in which a first electrode is formed in the emission position of each sub pixel may exist on the planarization layer L09.

In addition, a bank layer L11 is positioned on the first electrode layer L10, an electroluminescent layer L12 is positioned on the bank layer L11, and a second electrode layer L13 commonly formed in all sub-pixel area may exist on the electroluminescent layer L12.

An encapsulation layer L14 may be formed on the second electrode layer L13 to reduce foreign substances such as moisture and air from infiltrating. The encapsulation layer L14 may be implemented as a single layer, two or more layers may be stacked, or two or more organic and inorganic layers may be stacked.

At this time, in the non-display area of the display panel 110, there exists a dam DAM stacked higher than the surroundings for the purpose of reduce the likelihood of the encapsulation layer L14 from collapsing. The boundary portion SA1 between the display area and the non-display area and the boundary portions SA2, . . . , and SA5 in both sides of the dam DAM in the non-display area correspond to a high thickness-gap area having a steep slope.

In general, the display area may be considered as a low thickness-gap area NSA because a plurality of subpixels are disposed in a planar structure.

Here, since it is assumed that two dams are formed, five areas corresponding to the boundary portion SA1 between the display area and the non-display area and the boundary portions SA2, . . . , and SA5 in both sides of the dam DAM in the non-display area may be classified into a high thickness-gap area. On the other hand, when only one dam DAM is formed, three areas including the boundary portion SA1 between the display area and the non-display area and both boundary portions SA2 and SA3 of the dam DAM in the non-display area may correspond to a high thickness-gap area.

Since a residual film of the photo resist may remain in the high thickness-gap area SA1, . . . , and SA5 during the process of etching the encapsulation layer L14 or the touch line TL, the photo resist positioned in the upper portion of the portion corresponding to the high thickness-gap area SA1, . . . , and SA5 is formed in a slit pattern, thereby reducing a thickness-gap and solving a short circuit failure caused by the residual film of the photo resist.

On the other hand, since the area excluding the high thickness-gap area SA1, . . . , and SA5 having a steep slope has a gentle slope or a planar structure, there is no need to use a photo resist with slit patterns. Accordingly, it may be referred to as a low thickness-gap area NSA or non-slit area.

As described above, when the photo resist of the portion corresponding to the high thickness-gap area SA1, . . . , SA5 is formed in a slit pattern, the light incident through the photo resist of the slit pattern reaches some of the etching area of the encapsulation layer L14 or the touch line TL, but does not reach other area, so that the thickness-gap is reduced as the etched degree of the encapsulation layer L14 or the touch line TL is alleviated in comparison with the case of being completely exposed to light.

FIG. 8 is a diagram illustrating a photo resist of a slit pattern corresponding to a high thickness-gap area of a display panel in a touch display device according to embodiments of the present disclosure.

Figure 8A:
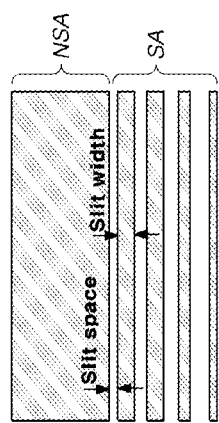
FIGS. 8A and 8B are diagrams illustrating a photo resist with slit patterns corresponding to a high thickness-gap area of a display panel in a touch display device according to embodiments of the present disclosure.
Figure 8B:
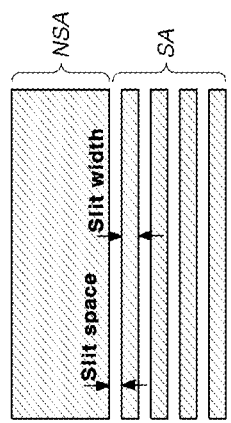

Referring to FIGS. 8A and 8B, in the touch display device 100 according to embodiments of the present disclosure, the photo resist used in the process of forming the encapsulation layer L14 of the display panel 110 may be classified into a slit pattern area corresponding to the high thickness-gap area SA and a planar area corresponding to the low thickness-gap area NSA.

At this time, the width of the slit pattern area has a width corresponding to the high thickness-gap area SA, but may be formed of a plurality of separate slits.

In particular, the slit pattern area of the photo resist may be formed of a plurality of separate slits having the same width (FIG. 8A, or formed of a plurality of separate slits of different widths in a direction away from the planar area (FIG. 8B).

The plurality of separate slits having different widths may have a structure in which the width gradually decreases in a direction away from the planar area, or a structure in which the width gradually increases in a direction away from the planar area.

At this time, the slit width of the photo resist may vary depending on the material of the photo resist.

Figure 9:
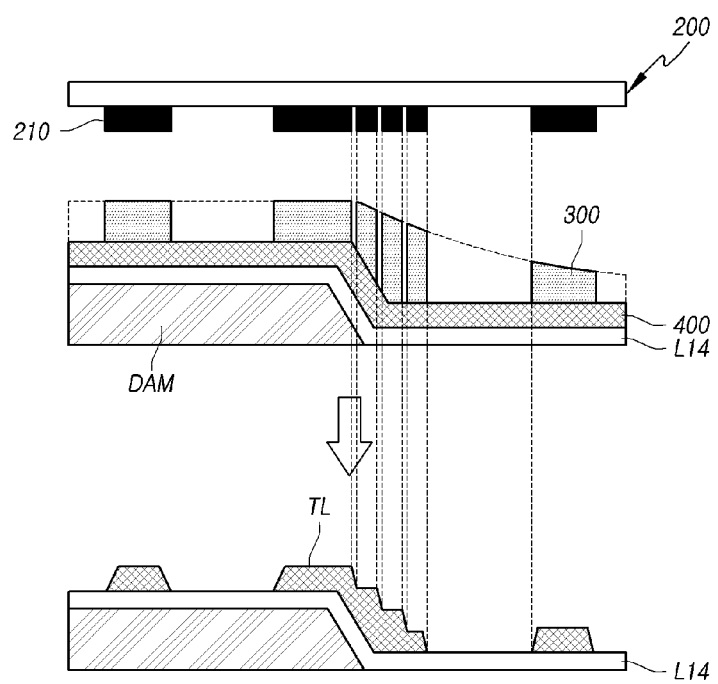
FIG. 9 is a cross-sectional view illustrating an example of a process of forming a touch line in an upper portion of dam of a non-display area in a touch display device according to embodiments of the present disclosure.

FIG. 9 is a cross-sectional view illustrating an example of a process of forming a touch line in an upper portion of dam of a non-display area in a touch display device according to embodiments of the present disclosure.

Referring to FIG. 9, in the non-display area of the touch display device 100 according to embodiments of the present disclosure, the encapsulation layer L14 and the conductive layer 400 for touch line TL may be deposited to cover the dam DAM.

The upper portion of the conductive layer 400 is coated with a liquid photo resist 300. At this time, the photo resist 300 corresponding to the high thickness-gap area, such as a boundary surface of the dam DAM, where the thickness-gap is increased, is formed in a slit pattern.

To this end, the light blocking layer 210 located in a position corresponding to the slit pattern area may be formed in a slit pattern and exposed through the photo mask 200.

In the photo resist 300 formed in the slit pattern, due to fluidity, a thickness-gap of the photo resist 300 positioned in the high thickness-gap area between the side surface of the dam DAM and the protective layer L08 is reduced. Thus, an effective development proceeds with respect to the area between the side surface of the dam DAM and the protective layer L08, so that no residual film remains.

At this time, in order to effectively form the photo resist 300 with slit patterns, the photo resist 300 may be selectively exposed using a halftone mask or a diffraction mask.

As described above, when the conductive layer 400 of the boundary portion SA1 between the display area and the non-display area and the boundary portions SA2, . . . , and SA5 in both sides of the dam DAM in the non-display area is formed in a stepped thickness-gap structure by using the photo resist 300 with slit patterns, it is possible to reduce a short circuit failure of the touch line TL by preventing the residual film of the photo resist used in the etching process from remaining.

At this time, the touch line TL formed by the photo resist 300 with slit patterns may have a thickness-gap structure corresponding to the slit patterns of the photo resist 300. That is, when the slit patterns of the photo resist 300 is formed of the same width, the touch line TL formed in the boundary surface of the dam DAM will also be formed in a stepped thickness-gap having the same width. When the photo resist 300 has a plurality of separate slits having a different width in a direction away from the planar area, stepped thickness-gap having a different width may be formed along the boundary surface of the dam DAM.

In addition, the present disclosure may extend the line width of the touch line TL passing through the protruding area of the dam DAM formed in the non-display area of the display panel 110 in the longitudinal direction of the dam DAM, thereby reducing the disconnection of the touch line TL.

Figure 10:
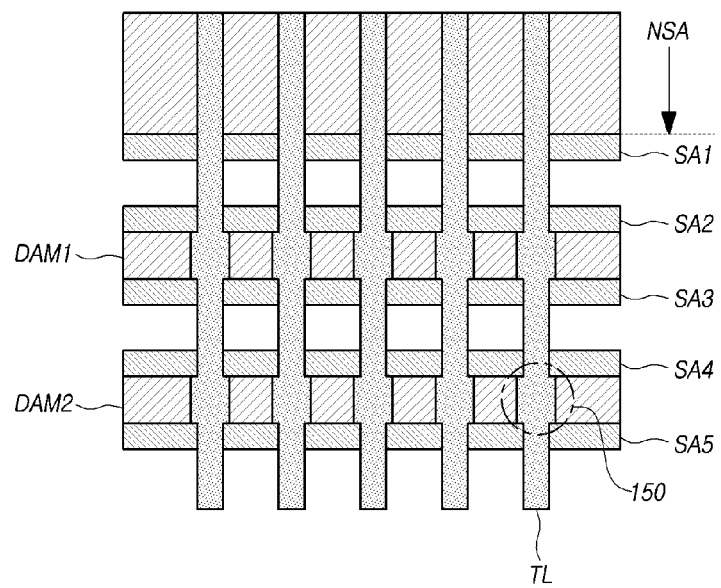
FIG. 10 is a plan view illustrating a case in which a line width of a touch line is extended in a longitudinal direction of a dam in an upper portion of a dam positioned in a non-display area of a display panel in a touch display device according to embodiments of the present disclosure.

FIG. 10 is a plan view illustrating a case in which a line width of a touch line is extended in a longitudinal direction of a dam in an upper portion of a dam positioned in a non-display area of a display panel, in a touch display device according to embodiments of the present disclosure.

Referring to FIG. 10, in the touch display device 100 according to embodiments of the present disclosure, a dam DAM protruding from the lower surface may be disposed in the non-display area of the display panel 110.

Such a dam DAM may be disposed in a direction parallel to the outer edge of the display panel 110 to reduce the likelihood of the encapsulation layer L14 from collapsing, and two dams DAM1, DAM2 may be disposed to be adjacent.

In this case, as the touch line TL is disposed in the non-display area so as to connect the touch electrode TE and the driving circuit 120, it may be disposed in the direction intersecting the dam DAM positioned in the outer edge of the display panel 110. That is, the touch line TL is disposed in a direction intersecting the dam DAM, and may be disposed along the shape of the dam DAM.

Here, since the touch line TL may be disconnected because the thickness of the portion positioned in the upper portion of the dam DAM becomes thin due to the protruding shape of the dam DAM, the line width of the touch line TL positioned in the upper portion of the dam DAM forms a touch line compensation area 150 extended in the longitudinal direction of the dam DAM.

Accordingly, since the line width of the touch line TL positioned in the upper portion of the dam DAM is wider than the line width of other portion, even if the thickness of the touch line TL becomes thin in some section of the upper portion of the dam DAM, it is possible to prevent the touch line TL from being disconnected.

The touch line compensation area 150 may be formed in a process of forming the touch line TL in the upper portion of the encapsulation layer L14.

In addition, the touch line compensation area 150 may be formed by extending the line width of the touch line TL positioned in the upper portion of the dam DAM in the longitudinal direction of the dam DAM, while forming the boundary portion between the display area and the non-display area or both boundary portions of the dam in a stepped thickness-gap structure, thereby simultaneously reducing the short circuit and disconnection failures of the touch line TL.

The above description has been presented to enable any person skilled in the art to make and use the technical idea of the present invention, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present invention. The above description and the accompanying drawings provide an example of the technical idea of the present invention for illustrative purposes only. That is, the disclosed embodiments are intended to illustrate the scope of the technical idea of the present invention. Thus, the scope of the present invention is not limited to the embodiments shown, but is to be accorded the widest scope consistent with the claims. The scope of protection of the present invention should be construed based on the following claims, and all technical ideas within the scope of equivalents thereof should be construed as being included within the scope of the present invention.

What is claimed is:

1. A touch display device comprising:
a display panel in which a plurality of touch electrodes are disposed;
at least one dam protrudes such that the at least one dam is stacked higher than surroundings in a non-display area of the display panel;
a plurality of touch lines disposed in a direction intersecting the at least one dam;
an encapsulation layer comprising an upper portion and an inclined portion, which a respectively disposed along an upper surface and an inclined surface of the at least one dam, and a lower portion; and a stepped thickness-gap area in which a boundary portion of the non-display area or both sides of the dam comprises a plurality of stepped thickness-gap structures, wherein the plurality of touch lines are disposed to contact the upper portion, the inclined portion, and the lower portion of the encapsulation layer, and the lower portion of the encapsulation layer disposed to contact an end of a bottom surface of the at least one dam and disposed on a layer on which the at least one dam is disposed, and at least part of the plurality of touch lines corresponding to the both sides of the dam includes the plurality of stepped thickness-gap structures.

2. The touch display device of claim 1, wherein the plurality of thickness-gap structures have a same width.

3. The touch display device of claim 1, wherein the plurality of thickness-gap structures have a different width.

4. The touch display device of claim 1, wherein a width of the plurality of thickness-gap structures decreases as it moves away from a display area of the display panel or the dam.

5. A display panel comprising:
an encapsulation layer comprising an upper portion, an inclined portion, and a lower portion;
at least one dam disposed in an outer periphery of the encapsulation layer in one direction and protruded such that the at least one dam is stacked higher than surroundings;
a plurality of touch lines disposed to contact the upper portion and the inclined portion of the encapsulation layer, which are respectively disposed along an upper surface and an inclined surface of the at least one dam, and the lower portion of the encapsulation layer disposed to contact an end of a bottom surface of the at least one dam and disposed on a layer on which the at least one dam is disposed, and disposed in a direction intersecting the at least one dam; and
a stepped thickness-gap area in which a boundary portion of the display area or both sides of the at least one dam comprises a plurality of stepped thickness-gap structures,
wherein at least part of the plurality of touch lines corresponding to the both sides of the dam includes the plurality of stepped thickness-gap structures.

6. The display panel of claim 5, wherein the plurality of thickness-gap structures have a same width.

7. The display panel of claim 5, wherein the plurality of thickness-gap structures have a different width.

8. The display panel of claim 5, wherein the a width of the plurality of thickness-gap structures decreases as it moves away from the display area or the dam.

9. A method of manufacturing a display panel, the method comprising:
forming an encapsulation layer in a lower portion of a display area so as to reduce foreign matter from penetrating the display area, the encapsulation layer comprising an upper portion, an inclined portion, and a lower portion;
forming a metal layer in an outer periphery of the encapsulation layer;
forming a photo resist with slit patterns in an area corresponding to a boundary portion of the display area or both sides of a dam that is stacked higher than surroundings; and
etching a portion of the metal layer or the encapsulation layer by using the photo resist with slit patterns so that the boundary portion of the display area or the both sides of the dam comprises a plurality of stepped thickness-gaps,
wherein the upper portion and the inclined portion of the encapsulation layer are respectively disposed along an upper surface and an inclined surface of the dam, and
wherein at least one touch line resulting from the etching of the portion of the metal layer is disposed to contact the upper portion, the inclined portion, and the lower portion of the encapsulation layer, and the lower portion of the encapsulation layer disposed to contact an end of a bottom surface of the dam and disposed on a layer on which the dam is disposed,
wherein at least part of the at least one touch line corresponding to the both sides of the dam includes the plurality of stepped thickness-gaps.

10. The method of claim 9, wherein the photo resist comprises:
a slit pattern area corresponding to a stepped thickness-gap area; and
a planar area corresponding to an area excluding the stepped thickness-gap area.

11. The method of claim 10, wherein the slit pattern area comprises a plurality of separate slits having a same width.

12. The method of claim 10, wherein the slit pattern area comprises a plurality of separate slits having a different width.

13. The method of claim 10, wherein the slit pattern area comprises a plurality of separate slits whose width decreases as it moves away from the display area or the dam.

14. The method of claim 11, wherein the width of the plurality of separate slits varies depending on material of the photo resist.

15. The method of claim 9, wherein the photo resist with the slit patterns is formed using a halftone mask or a diffraction mask.

16. A touch display device comprising:
a display panel in which a plurality of touch electrodes are disposed;
at least one dam protrudes such that the at least one dam is stacked higher than surroundings in a non-display area of the display panel;
an encapsulation layer comprising an upper portion and an inclined portion, which are respectively disposed along an upper surface and an inclined surface of the at least one dam, and a lower portion; and
a plurality of touch lines disposed in a direction intersecting the at least one dam, and having a touch line compensation area in which a line width of a touch line from the plurality of touch lines is positioned in a protruding portion of the at least one dam is extended in a length direction of the at least one dam,
wherein the plurality of touch lines are disposed to contact the upper portion, the inclined portion, and the lower portion of the encapsulation layer, and the lower portion of the encapsulation layer disposed to contact an end of a bottom surface of the at least one dam and disposed on a layer on which the at least one dam is disposed,
wherein at least part of the plurality of touch lines corresponding to both sides of the at least one dam comprises a plurality of stepped thickness-gap structures.

17. The touch display device of claim 16, further comprising a stepped thickness-gap area in which a boundary portion of the non-display area or the both sides of the dam comprises the plurality of a stepped thickness-gap structures.

18. The touch display device of claim 17, wherein the stepped thickness-gap area comprises the plurality of thickness-gap structures having a same width.

19. The touch display device of claim 17, wherein the stepped thickness-gap area comprises the plurality of thickness-gap structures having a different width.

20. The touch display device of claim 17, wherein the stepped thickness-gap area comprises the plurality of thickness-gap structures whose width decreases as it moves away from the display area or the dam.

21. A display panel comprising:
- an encapsulation layer comprising an upper portion, an inclined portion, and a lower portion;
- at least one dam disposed in an outer periphery of the encapsulation layer in one direction and formed in a form of protruding from a lower surface; and
- a plurality of touch lines disposed in a direction intersecting the at least one dam, and having a touch line compensation area in which a line width of a touch line from the plurality of touch lines is positioned in a protruding portion of the at least one dam is extended in a length direction of the at least one dam, wherein the plurality of touch lines are disposed to contact the upper portion and the inclined portion of the encapsulation layer, which are respectively disposed along an upper surface and an inclined surface of the at least one dam, and the lower portion of the encapsulation layer disposed to contact an end of a bottom surface of the at least one dam and disposed on a layer on which the at least one dam is disposed, wherein at least part of the plurality of touch lines corresponding to both sides of the at least one dam includes a plurality of stepped thickness-gap structures.

\* \* \* \* \*